US007821632B2

(12) United States Patent
Jung et al.

(10) Patent No.: US 7,821,632 B2
(45) Date of Patent: Oct. 26, 2010

(54) SAMPLE TRAVELING STAGE WITH FLEXURE MECHANISM MODULE TO ABSORB THE DEFORMATION OF THE SLIDE

(75) Inventors: Hun Taek Jung, Sungnam (KR); Dae Gab Gweon, Daejeon (KR); Jung Jae Kim, Daejeon (KR); Young-Man Choi, Daejeon (KR); Da Hoon Ahn, Jinju (KR)

(73) Assignees: Soonhan Engineering Corp., Kyungki-Do (KR); Korea Advanced Institute of Science and Technology, Daejeon (KR)

( * ) Notice: Subject to any disclaimer, the term of this patent is extended or adjusted under 35 U.S.C. 154(b) by 231 days.

(21) Appl. No.: 12/186,712

(22) Filed: Aug. 6, 2008

(65) Prior Publication Data

US 2009/0051911 A1 Feb. 26, 2009

(30) Foreign Application Priority Data

Aug. 20, 2007 (KR) ...................... 10-2007-0083496
Jan. 17, 2008 (KR) ...................... 10-2008-0005417

(51) Int. Cl.
*G01N 21/01* (2006.01)

(52) U.S. Cl. ......................... 356/244; 356/399; 355/53; 355/72; 108/20; 248/562

(58) Field of Classification Search ................. 356/244, 356/399–401; 269/73, 71, 285, 307; 359/872, 359/846; 355/97, 30, 67, 72, 53; 414/217, 414/222.04, 936, 939; 108/20, 57.12; 248/562
See application file for complete search history.

(56) References Cited

U.S. PATENT DOCUMENTS 5,101,301 A 3/1992 Iwase et al.

(Continued)

FOREIGN PATENT DOCUMENTS

JP 11-154698 6/1999

OTHER PUBLICATIONS

Search Report, European Application No. 08013979.3 dated Nov. 4, 2008.

*Primary Examiner*—Hoa Q Pham
(74) *Attorney, Agent, or Firm*—Kenyon & Kenyon LLP

(57) ABSTRACT

A sample traveling stage is used for inspection equipment or precision processing equipment for semiconductors or FPDs, (Flat Panel Displays). The sample traveling stage includes a moving part in which a first slide, which is mounted on a base frame and moves along a first guide block, and a second slide, which is mounted on the first slide and moves along a second guide block, is installed in a mutually crossing direction. A traveling part that travels sample through the sample table is installed by a flexure mechanism module formed on the second slide and measures displacement through the X, Y bar mirror installed at the above sample table in a mutually vertical direction. A measuring part includes a laser head, a beam divider, and an interferometer installed at the operating path of the moving part forms the output into a displacement signal by receiving the input beam interference signal reflected by the X, Y bar mirror from receiver. The deformation error of the mirror and sample, including the sample table, decreases because deformation by the slide is not delivered to the sample table, and measuring accuracy improves because the relative distance of the mirror and the sample is set. Productivity improves due to the minimization of defective proportions because the accuracy is improved.

9 Claims, 14 Drawing Sheets

U.S. PATENT DOCUMENTS 5,966,200 A * 10/1999 Kawakami et al. ............ 355/53
6,283,041 B1 9/2001 Ono
6,285,444 B1 * 9/2001 Osanai et al. ................. 355/72
6,404,505 B2 * 6/2002 Matsui ....................... 356/620
7,049,592 B2 * 5/2006 Franken et al. .............. 250/311
7,384,228 B2 * 6/2008 Kuipers et al. .............. 414/217
2002/0185799 A1 12/2002 Mizuochi et al.
2003/0020225 A1 1/2003 Mizuochi et al.
2008/0111977 A1 * 5/2008 del Puerto et al. ............. 355/30

* cited by examiner

[Fig. 1]
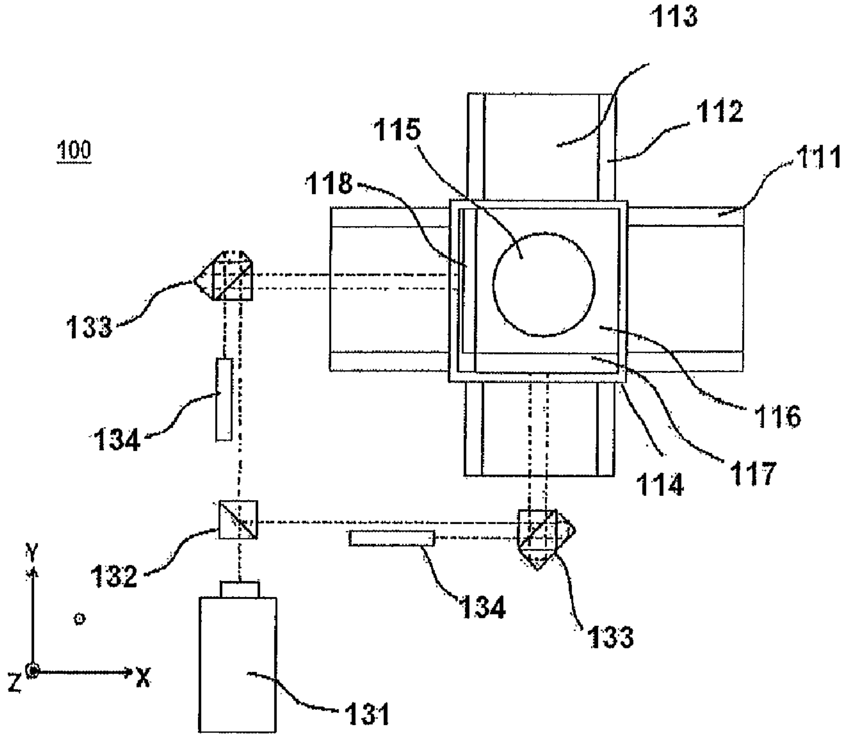
[Fig. 2]
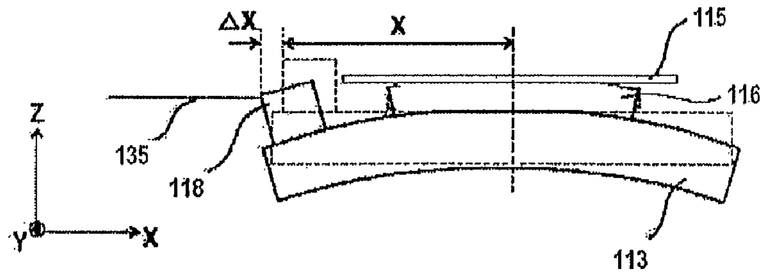
PRIOR ART

[Fig.3]
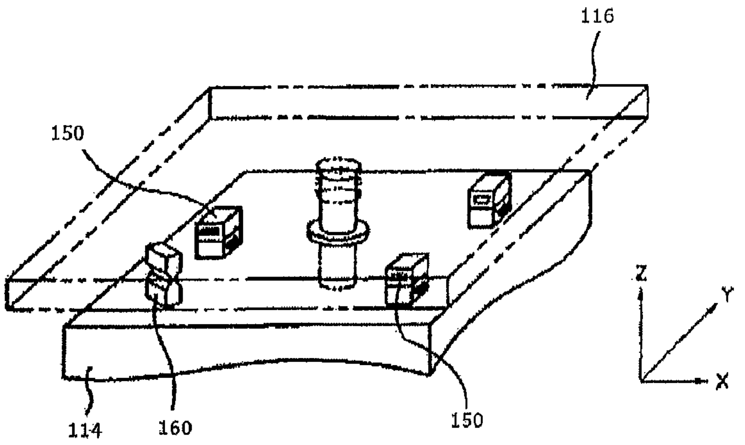
[Fig.4]
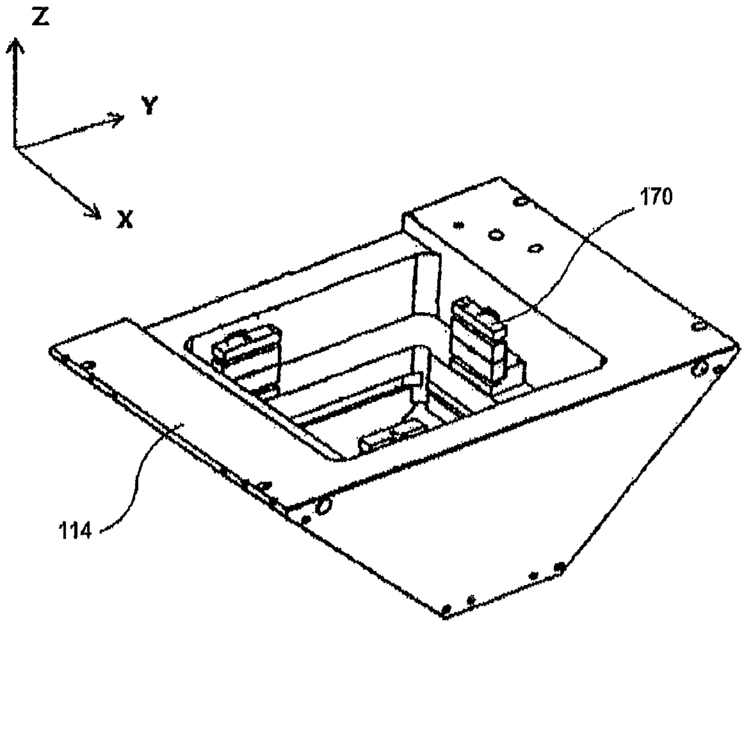
PRIOR ART

[Fig.5]
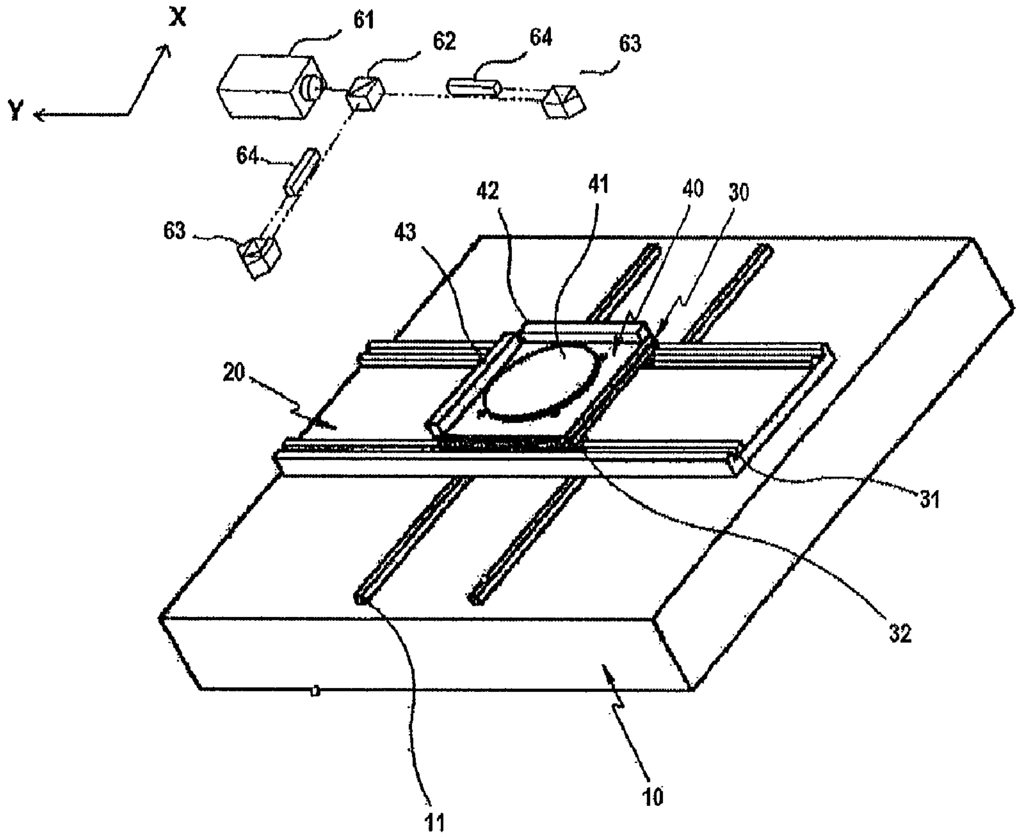

[Fig.6]
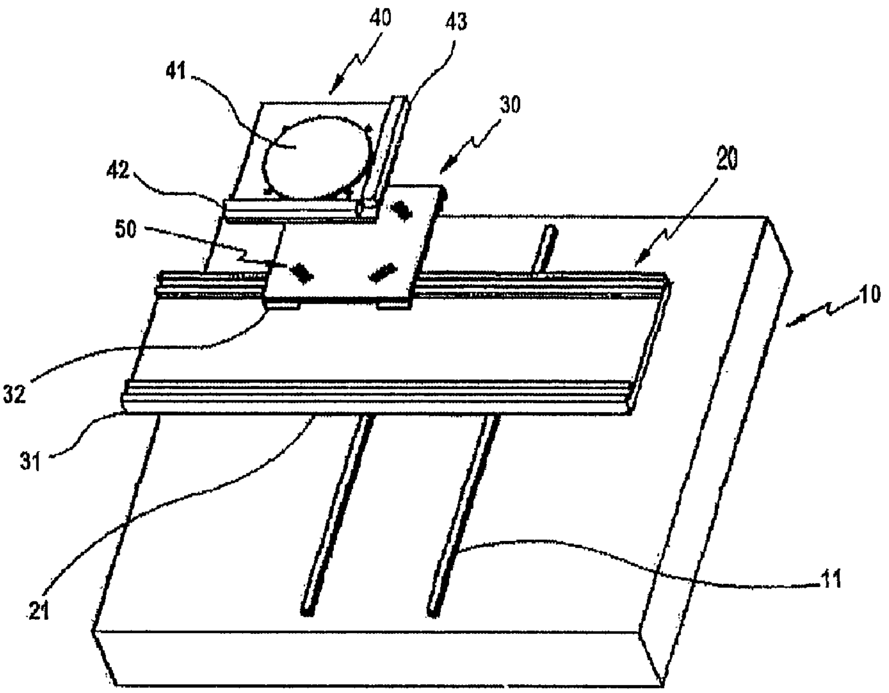
[Fig.7]
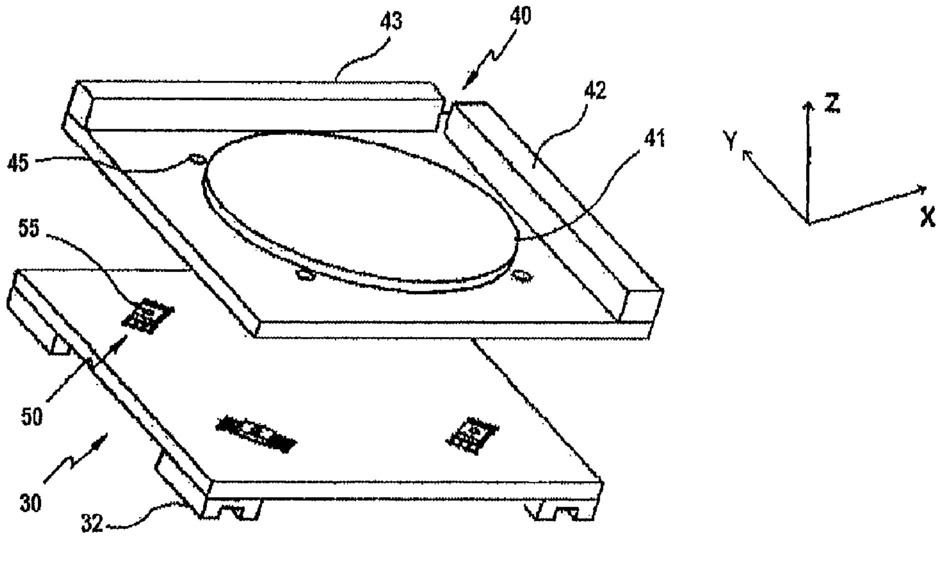

[Fig.8a]
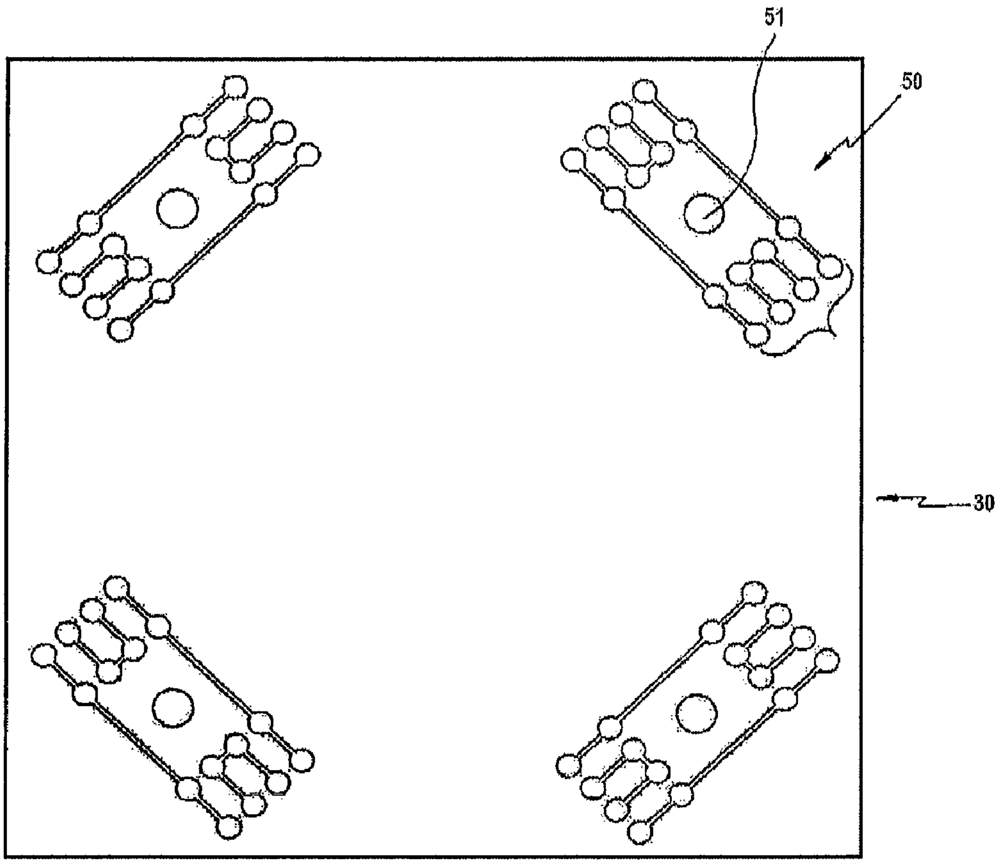

[Fig.8b]
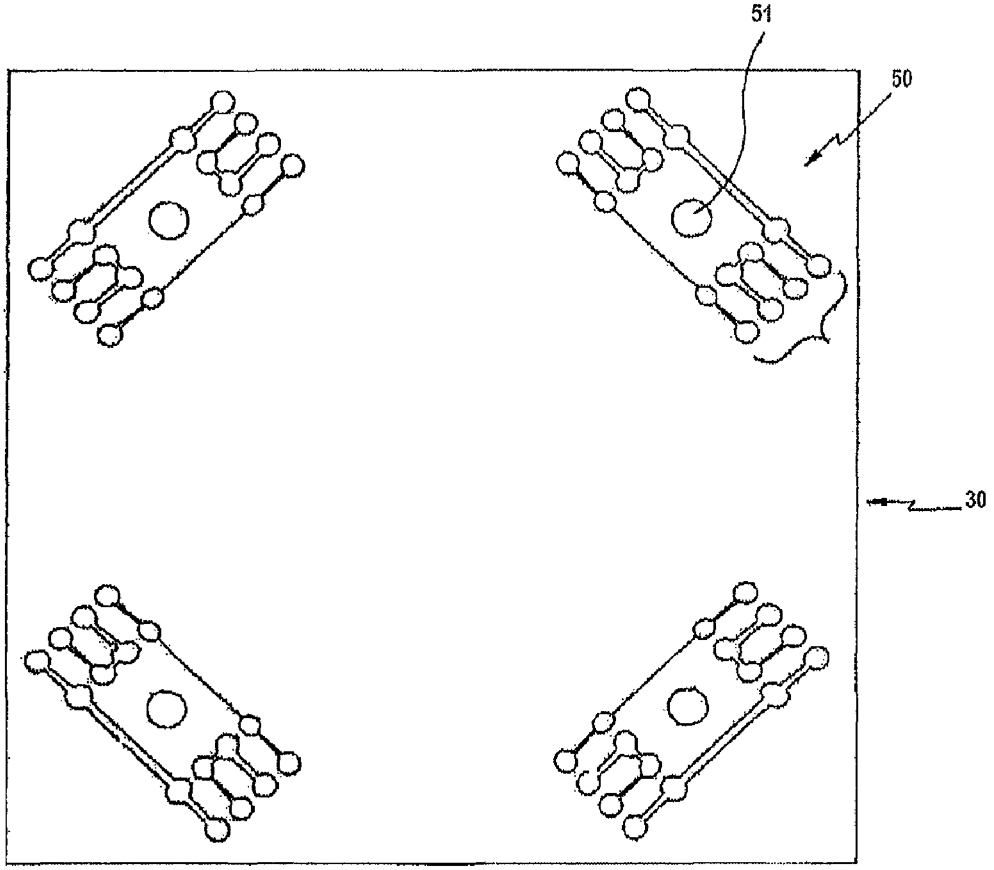

[Fig.9a]
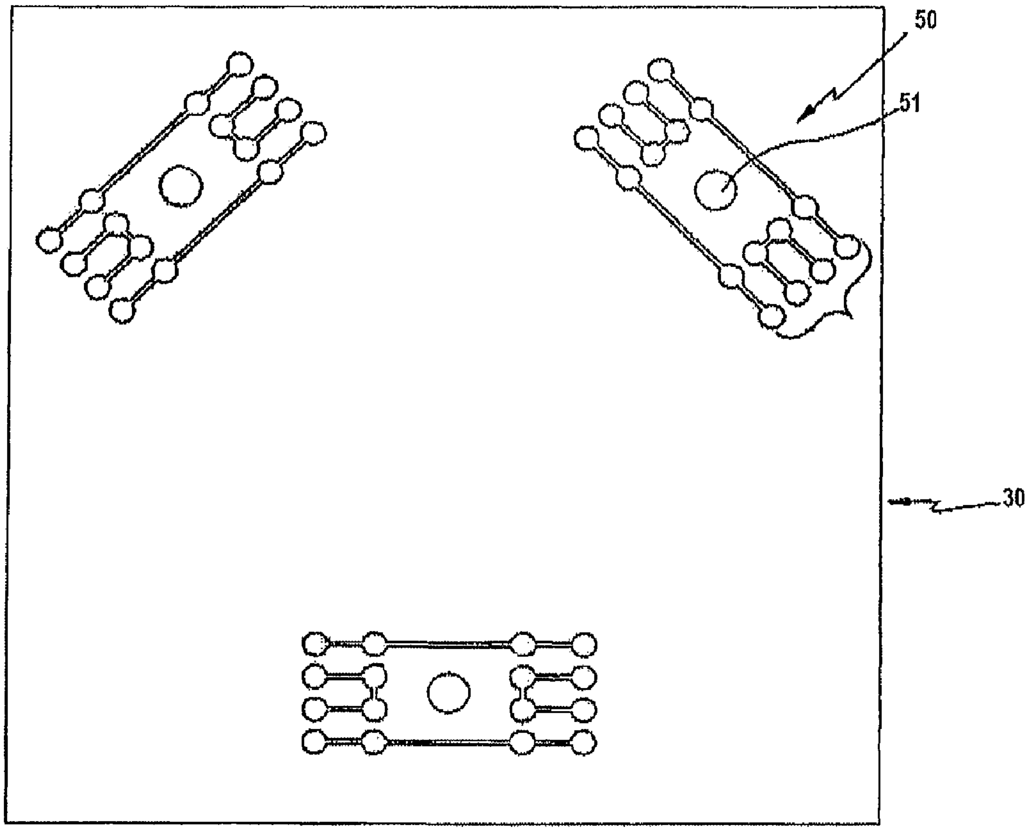

[Fig.9b]
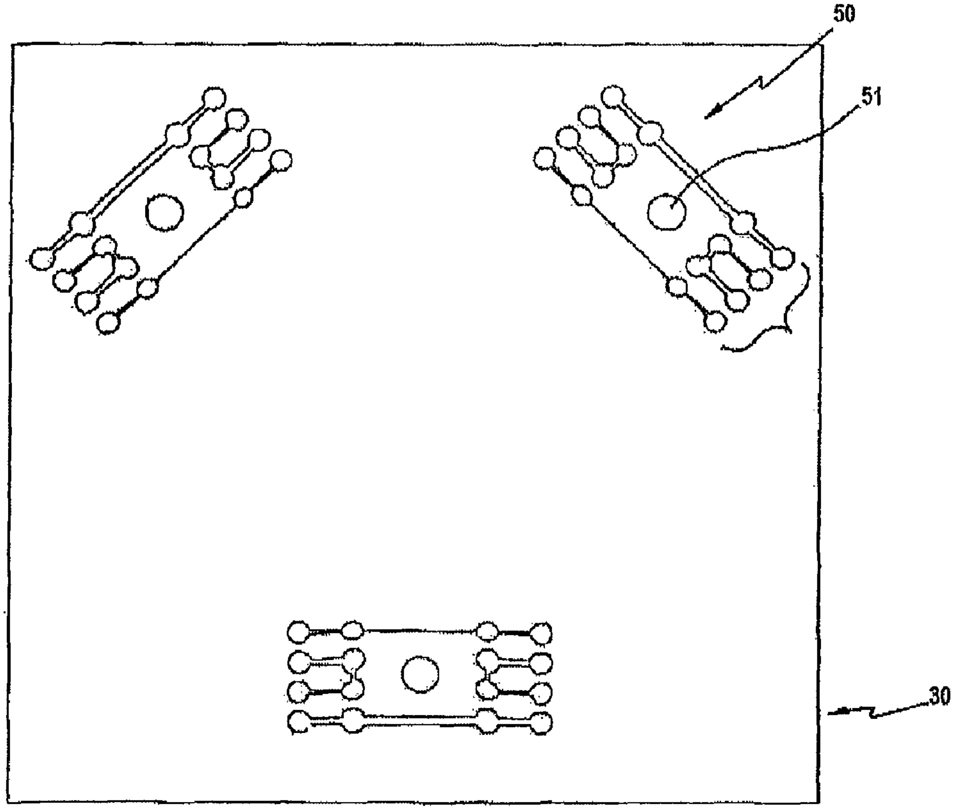
[Fig.10]
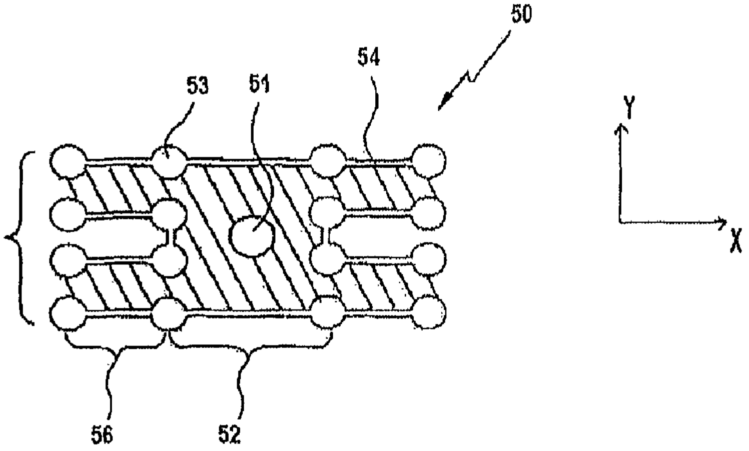

[Fig. 11]
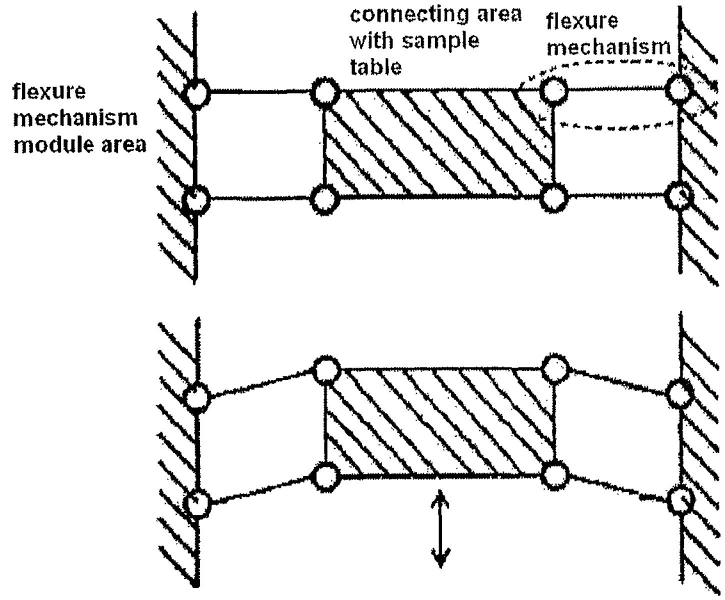
[Fig. 12]
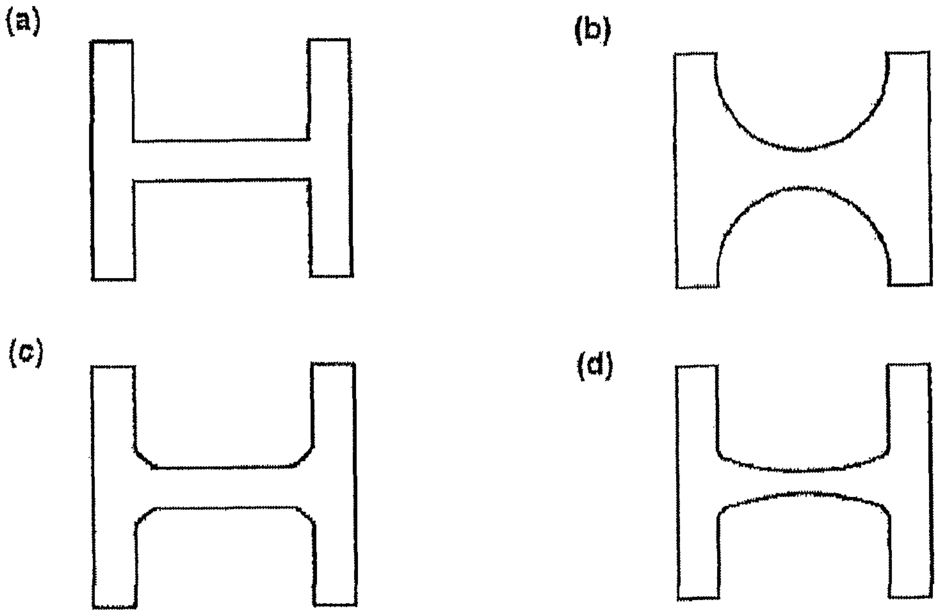

[Fig. 15]
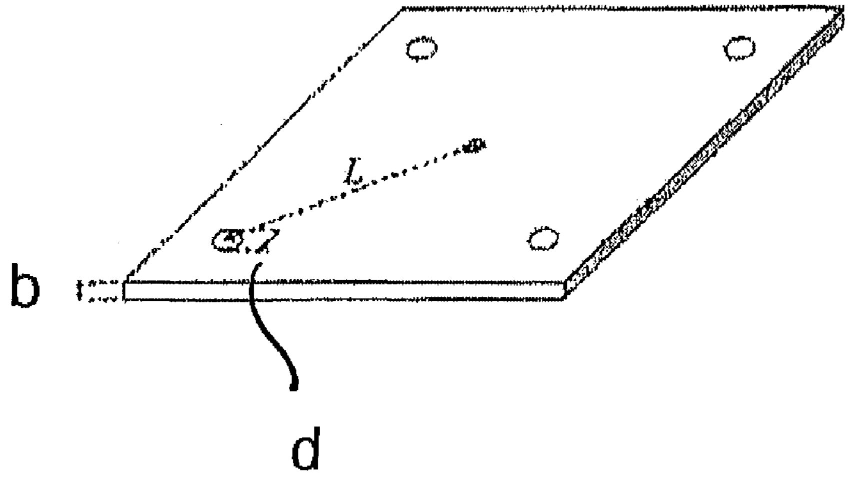
[Fig. 16]
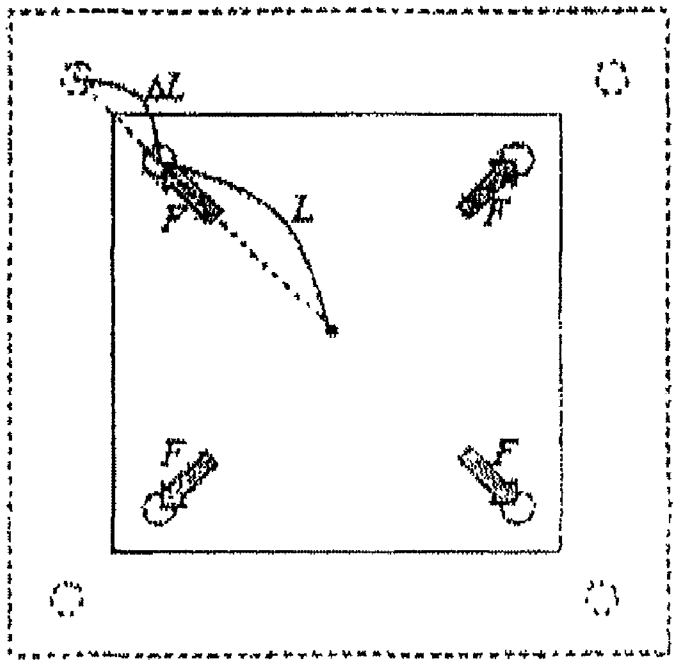

[Fig. 17]
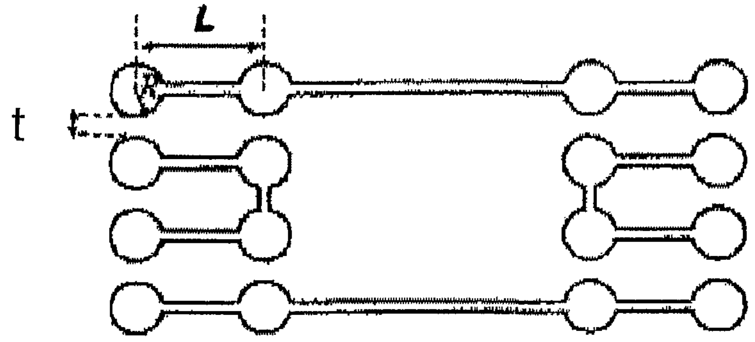
[Fig. 18]
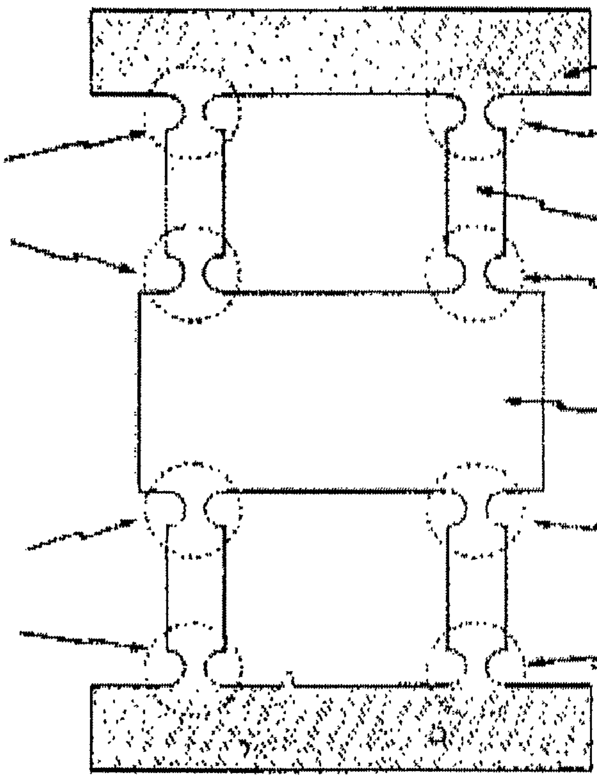

SAMPLE TRAVELING STAGE WITH FLEXURE MECHANISM MODULE TO ABSORB THE DEFORMATION OF THE SLIDE

CROSS-REFERENCE TO RELATED APPLICATIONS

The present application claims priority to Application No. 2007-0083496, filed in the Republic of Korea on Aug. 20, 2007, and to Application No. 2008-0005417, filed in the Republic of Korea on Jan. 17, 2008, each of which is expressly incorporated herein in its entirety by reference thereto.

FIELD OF THE INVENTION

The present invention relates to a sample traveling stage with a flexure mechanism module to absorb the deformation of the slide.

For example, the present invention relates to a sample traveling stage to be used for inspection equipment or precision processing equipment for semiconductors or FPDs, (Flat Panel Displays), and, in particular, relates to a sample traveling stage with a flexure mechanism to absorb the deformation of the slide in order to improve measuring accuracy by protecting against the deformation, which occurs as a result of the slide of the sample traveling stage, being delivered to the sample table.

BACKGROUND INFORMATION

In general, a sample traveling stage is an equipment item used for loading, travel measuring, and/or processing an object (or sample, used for inspection equipment or precision processing equipment of semiconductors or FPDs to a desired location; and it is used for a laser displacement measuring system to analyze the displacement signal with the signal measured by the interference between the incident laser beam to the mirror and the reflected laser beam by the mirror.

For example, as illustrated in FIG. 1, sample traveling stage (100) has a main body part that includes X, Y slide (113, 114) guided by X, Y guide (111, 112) in a mutual crossing direction, sample table (116) mounted on the above Y slide (114) and moving sample (115), and the X, Y bar mirror attached to the above sample table (116) in a mutually vertical direction. A measuring part includes an interferometer (133) to diffuse the X, Y beam, which is output at laser head (131) after being mounted on the operating path of the above main body part and divided through beam divider (132), by the above X, Y bar mirror (117, 118), and X, Y receiver (134) so as to convert the interference signal, which is reflected by the above X, Y bar mirror (117, 118), into a displacement signal.

Accordingly, because the sample position measurement by sample traveling stage (100) has a structure measured by the interference between X, Y bar mirror (117, 118) fixed to the above sample table (116) and the laser beam reflected by the X, Y bar mirror (117, 118), the problem in which relative displacement between the above X, Y bar mirror (117, 118) and the above sample (115) must be maintained regularly, needs to be resolved previously in order to measure the correct position of the above sample (115).

However, sample table (116) of sample traveling stage (100) can be deformed due to the following reasons. For example, slide (113, 114) is subject to a processing error of guide part (111, 112) or an error in terms of linearity and flatness. Furthermore, in the case that ambient temperature changes, the deformation degree is different due to differences in the thermal expansion coefficient between slide (113, 114) and sample table (116), and, particularly, in cases where slide (113, 114) and sample table (116) are subject to connecting tools such as a bolt, problems relating to the deformation of slide (113, 114) occur as it is delivered to sample table (116).

These situations cause a deformation of mirror (118) and sample (115), and change the relative distance between the two during the usage process of sample traveling stage (100) as illustrated in FIG. 2, where sample table (116) is deformed due to the above reasons. These directly cause measuring errors and make the correct positioning of the sample difficult.

Furthermore, if the alignment of the laser beam is twisted due to tilt errors of mirror (118) caused by the deformation of sample table (116) when laser beam (135), output from the measuring part of sample traveling stage (100), enters the mirror, the interference between the incident beam and the reflected beam does not occur, and the measuring signal for displacement is lost. Losing the measuring signal at the displacement measuring system using laser beam (135) can be a serious problem insofar as it reduces control safety. Therefore, such instances should be prevented.

Referring to FIG. 3, U.S. Patent Application Publication No. 2003/0020225 describes a configuration in which deformation of slide (114) would not be imparted to sample table (116) by mounting three deformation preventing devices (150) having a motion free angle at the X, Y direction at the space between slide (114) and sample table (116).

U.S. Patent Application Publication No. 2003/0020225 additionally describes flexure mechanism (160) to restrict the motion in the X, Y direction in order to prevent the low strength in the X, Y direction of deformation preventing mechanism (150).

However, although U.S. Patent Application Publication No. 2003/0020225 describes flexure mechanism (160) as a deformation preventing mechanism reinforcement tool (150), it is difficult to compensate for the reduced strength in the X, Y direction. Furthermore, asymmetrical properties arise due to the asymmetrical structure when ambient temperature changes.

In addition, the height difference between sample (115) and slide (114) occurs due to the height of deformation preventing mechanism (150, 160). This causes a problem in terms of reduced stability because it forms a weight center in the drive unit and forms an offset between the drive unit operating point and the actual weight center.

Furthermore, as illustrated in FIG. 4, the configuration in which the deformation of slide (114) would not be delivered to sample table (116) is provided by configuring three buffering mechanisms (170) fixed with sample table (116) at the upper side of slide (114), and by permitting only a free angle toward the radius direction to become more distant from the center of the thermal expansion direction with the restriction of six free angles by the above buffering mechanism (170).

However, the above configuration has certain problems. For example, sample traveling stage (100) as illustrated in FIG. 4 has difficulties in terms of processing and assembly for buffering mechanism (170), and a height difference between sample table (116) and slide (114) occurs due to the height of buffering mechanism (170). This not only makes the weight center of the drive unit for sample traveling stage high, but also reduces control stability because this makes the offset between the point at which the drive force operates and the actual weight center.

For the precision equipment demanding super precision suitable for sample traveling stage (100), materials such as Invar or Zerodur, for the above slide (113, 114) and sample table (116) are used for a single body so as to resolve the above problems. However, this use has certain problems. For example, the cost of Invar or Zerodur is at least ten times that of aluminum, and processing costs also increase because of poor workability levels.

SUMMARY

Example embodiments of the present invention address the aforementioned problems and provide a sample traveling stage using a flexure mechanism module for slide deformation absorption, so as to prevent the deformation of the slide from being delivered to the sample table by the configuration of the flexure mechanism module for protecting the delivery of the reduced structure deformation of the upper structure, forming it into one body at the slide of the sample traveling stage, or combining it through the bolt connection at the slide area.

According to an example embodiment of the present invention, a sample traveling stage includes: a movable part including a first slide and a second slide arranged in a mutually crossing direction, the first slide mounted on a base frame and movable along a first guide block, the second slide mounted on the fist slide and movable along a second guide block; and a traveling part including a sample table configured to travel a sample, the sample table connected to the second slide by a flexure mechanism module.

The flexure mechanism module may include a plurality of shock-absorbing holes that penetrate an upper side of the second slide along a vertical direction regularly at certain intervals and a plurality of deformation lines that meet at centers of the shock-absorbing holes, and the flexure mechanism module may be configured to provide a deformation space of a bridge part and a mounting part and to absorb slide deformations.

A flexure mechanism module adapted to absorb slide deformation may be provided at each of four corners of the second slide.

A flexure mechanism module adapted to absorb slide deformation may be provided at two corners of one side and a second of another side of the second slide.

At least five flexure mechanism modules may be provided on the second slide one of (a) symmetrically and (b) asymmetrically.

An upper side of the mounting part may include a shock-absorbing material in contact with the sample table.

A contact area of the mounting part and the bridge part may have at least one of (a) linear shape, (b) a semi-circular shape, and (c) an elliptical shape.

The flexure mechanism module may be connected to the second slide.

At least one of the following criteria may be satisfied: (a) $\Delta x \geqq \Delta L$, $\Delta x$ representing a deformation degree of a flexure mechanism part and $\Delta L$ representing a deformation degree of a slide part; (b) $Fl/4 \leqq M_{max}$, $M_{max}$ representing a total mass of mounted parts, including the sample table and the sample, F representing a heat expansion force, and l representing a length of a link; and (c) $\sigma = \delta_{limit}$, $\sigma$ representing a sunk degree of a flexure mechanism part and $\delta_{limit}$ representing a sunk degree limit of the flexure mechanism part.

The traveling part may include X- and Y-bar mirrors mounted on the sample table. Furthermore, the sample traveling stage may include a measurement part including a laser head, a beam divider, and an interferometer arranged in an operating path of the movable part, and the measurement part may be configured to output a displacement signal by reception from a receiver of an input beam interference signal reflected by the X- and Y-bar mirrors.

The sample traveling stage using the flexure mechanism module for slide deformation of the slide absorption provides the following effects with the methods of configuring the flexure mechanism by one body to the second slide configured on the sample traveling stage, or by combining the manufactured flexure mechanism module to the slide area.

Measuring accuracy may improve because the deformation error of the mirror and the sample, including the sample table, decreases due to the non-delivery to the sample table of the deformation by the slide. Productivity may improve due to the minimization of the error rate because the accuracy of sample manufacturing improves.

Furthermore, manufacturing costs for components may decrease because it is possible to form the slide and flexure mechanism as one body during the manufacturing process of the sample traveling stage, and high productivity levels can be achieved because high-speed motion and high control stability is achieved due to the comparative lowering of the center of gravity.

Moreover, material costs, including those for the slide, can be reduced because, general, aluminum or an aluminum alloy can replace costly materials such as Invar or Zerodur during the manufacturing process of the sample traveling stage, and manufacturing costs also can be saved because the workability of components is improved.

Further features and aspects of example embodiments of the present invention are described in more detail below with reference to the appended Figures.

BRIEF DESCRIPTION OF THE DRAWINGS

FIG. 1 shows a conventional sample traveling stage.

FIG. 2 shows the deformation status of the slide configured to the conventional sample traveling stage.

FIG. 3 shows a conventional deformation preventing mechanism.

FIG. 4 shows a conventional shock-absorbing mechanism.

FIG. 5 shows the assembled state of a sample traveling stage according to an example embodiment of the present invention.

FIG. 6 is an exploded view of a sample traveling stage according to an example embodiment of the present invention.

FIG. 7 shows a flexure mechanism module of a sample traveling stage according to an example embodiment of the present invention.

FIGS. 8*a* and 8*b* illustrate an installation state and a deformation state of a flexure mechanism module according to example embodiments of the present invention.

FIGS. 9*a* and 9*b* illustrate an installation state and a deformation state of a flexure mechanism module according to example embodiments of the present invention.

FIG. 10 illustrates a flexure mechanism module according to example embodiments of the present invention.

FIG. 11 illustrates deformation of a flexure mechanism module according to example embodiments of the present invention.

FIGS. 12*a* to 12*d* illustrate exemplary configurations for a flexure mechanism according to example embodiments of the present invention.

FIG. 15 illustrates a slide part according to example embodiments of the present invention.

FIG. 16 illustrates a deformed slide part due to a temperature change.

FIG. 17 illustrates a flexure mechanism according to example embodiments of the present invention.

FIG. 18 illustrates a flexure mechanism according to example embodiments of the present invention.

DETAILED DESCRIPTION

Figure 13A:
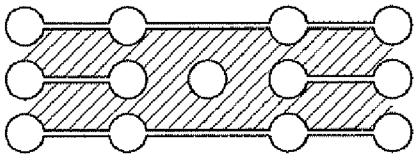
FIGS. 13*a* and 13*b* illustrate exemplary configurations for a flexure mechanism according to example embodiments of the present invention.

Example embodiments of the present invention are explained in more detail below.

FIGS. 5 and 6 illustrate assembled and disassembled states of the sample traveling stage, and FIG. 7 illustrates the flexure mechanism module for the sample traveling stage according to example embodiments of the present invention. FIGS. 8*a*, 8*b*, 9*a*, and 9*b* illustrate the installation state and deformation state of the flexure mechanism, and FIG. 10 illustrates a flexure mechanism module according to example embodiments of the present invention.

A moving part is provided in which a first slide (20), which is mounted on base frame (10) and moves along first guide block (21), and second slide (30), which is mounted on the first slide (20) and moves along second guide block (32), are installed in a mutually crossing direction. A traveling part travels sample (41) through sample table (40) connected to the flexure mechanism (50) provided on the second slide (30), and measures displacement through X, Y bar mirror (42, 43) installed at the sample table (40) in a mutually vertical direction. A measuring part includes a laser head (61), beam divider (62), and interferometer (63) installed at the operating path of the moving part, and outputs a displacement signal by receiving the input beam interference signal reflected by the X, Y bar mirror (42, 43) from receiver (64).

Sample traveling stage (1) in these examples includes a moving part to perform a reciprocal motion in the X axis and Y axis direction of the installed place, a traveling part to be mounted on the moving part and to convey measuring/processing object (41), or sample, and a measuring part to measure the position of sample (41), which is conveyed by the moving part, with a laser beam.

The moving part is mounted on base frame (10) and performs a reciprocal motion in the X and Y axis direction according to the external signal. The moving part is attached in the direction that first slide (20) and second slide (30), which are mounted on base frame (10), cross mutually.

First slide (20) is mounted on base frame (10), e.g., on a pair of guide rails (11) attached to the upper center of base frame (10) in parallel and at regular intervals, and performs a reciprocal motion in the X axis direction to move second guide block (32) connected to guide rail (31).

Second slide (30) is mounted on base frame (10), e.g., on a pair of guide rails (31) attached to the upper sides of first slide (20) in parallel and at regular intervals, and performs a reciprocal motion in the Y axis direction to move second guide block (32) connected to guide rail (31).

Traveling part is an object mounted on second slide (30) to convey sample (41), and includes sample table (40), which is mounted on second slide (30), whereby the sample is laid on the upper side, and flexure mechanism module (50), which is interposed between the sample table (40) and second slide (30), and absorbs the deformation of the second slide (30).

Sample table (40) is an object that performs a reciprocal motion by first slide (20) and second slide (30). X bar mirror (42) and Y bar mirror (43) measure the displacement of the laser beam attached on its upper side in a vertical direction.

Connecting holes are provided in second slide (30) and sample table (40), and are used during the connecting process of sample table (40).

Flexure mechanism module (50) is an object arranged at the upper side of second slide (30) and prevents the deformation of second slide (30) from being delivered or imparted to sample table (40). A flexure mechanism arranged at the flexure mechanism module deforms in the short axis direction as illustrated in FIG. 11, and maintains the shape of the sample table before the deformation of the slide during the deformation of the slide.

Accordingly, each flexure mechanism area of flexure mechanism module (50) is formed so that it may deform within a small range in the short axis direction, and, in particular, be manufactured with various kinds and shapes considering the workability properties and deformation shape of the flexure mechanism.

Referring to FIG. 10, flexure mechanism (50) includes several shock-absorbing holes (53) penetrated regularly at the upper side of the second slide (30) at regular intervals according to the upper and lower directions, several deforming lines (54), which are cut to meet the center of the shock-absorbing holes (53), and which provide a deforming space of bridge part (56) and mounting part (52) on which the sample table (40) is mounted.

One or more bridge part(s) (56) may be formed at both sides of mounting parts (52) into one body.

Connecting holes (51) formed at mounting part (52) are provided by the use of connecting tools, such as the sample table (40) and bolts.

Shock-absorbing holes may be processed so as to be at accurate positions and of accurate sizes, and the deforming lines (54) may be processed by wire-EDM in order to meet the positions of shock-absorbing holes (53).

The flexure mechanism may be configured according to various types, such as a plate spring type flexure mechanism, which forms the contacting surface of mounting part and bridge part into linear shapes, as illustrated in FIG. 12*a*, a right circular hinge flexure mechanism, which forms the contacting surface of mounting part and bridge part into semicircular shapes, as illustrated in FIG. 12*b*, a corner filleted hinge flexure mechanism, which forms a contacting surface of mounting part and bridge part into shapes, as illustrated in FIG. 12*c*, and an elliptical hinge flexure mechanism, which forms a contacting surface of mounting part and bridge part into ellipses, as illustrated in FIG. 12*d*, etc.

A plate spring type flexure mechanism can create large displacement levels, but has the disadvantage whereby the strength of the direction beside the axes permitting deformation is comparatively weak. In contrast, the right circular hinge flexure mechanism has the advantage of adequate axis strength properties, although deformation levels are comparatively small.

Furthermore, there is an elliptical hinge flexure mechanism or a corner filleted hinge flexure mechanism that compensates for the advantages and disadvantages of the two kinds of flexure mechanism. Thus, various configurations for the flexure mechanism are possible, as illustrated in FIGS. 12*a* to 12*d*.

Figure 13B:
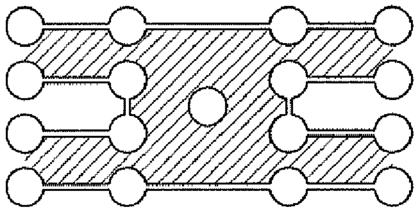

FIGS. 13 and 13*b* illustrate an example of a shape using a right circular hinge flexure mechanism, which can change in a short axis direction through a four-bar linkage. In addition to the above example, a more complicated mechanism may be provided, although the processing of the four-bar mechanism may be simplest.

Flexure mechanism (50) can be arranged on the flexure mechanism module in order to prevent the deformation of the slide from being delivered to the sample table. Basically, the flexure mechanism, of which the deformation of the short axis direction is permitted so as to restrict three free angles on the plane, is available from at least three units. More units may be provided.

Accordingly, three flexure mechanisms may be provided, e.g., at both corners of one side and at the center of the other side of second slide (30) as illustrated in FIGS. 9*a* and 9*b*, or four flexure mechanisms may be arranged at four corners of second slide (30) as illustrated in FIGS. 8*a* and 8*b*.

Figure 14A:
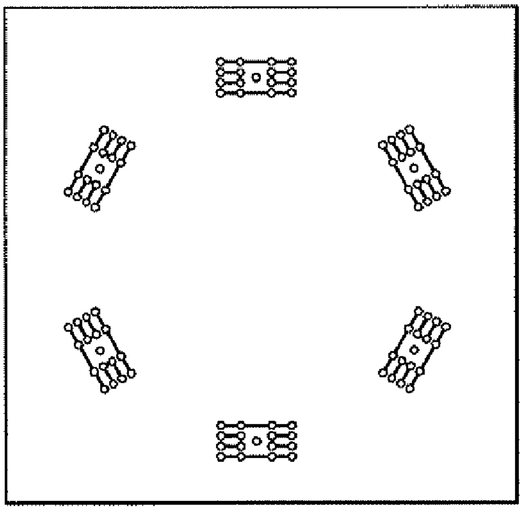
FIGS. 14*a* and 14*b* illustrate exemplary arrangements of flexure mechanisms according to example embodiments of the present invention.
Figure 14B:
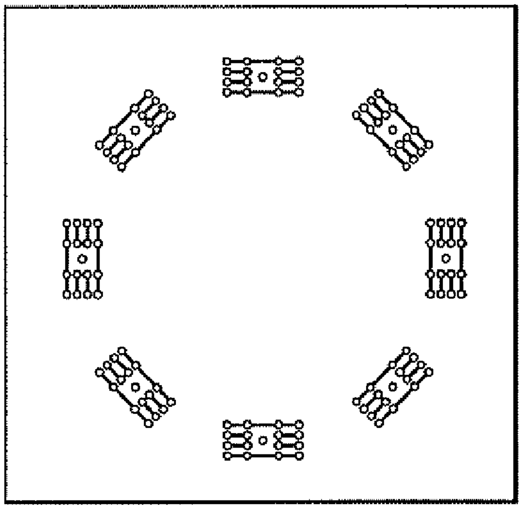

Six, eight, or more flexure mechanisms can be arranged into a flexure mechanism module as illustrated in FIGS. 14*a* and 14*b*. The arrangement of the flexure mechanism does not need to be symmetrical, e.g., five or seven units may be arranged asymmetrically, and heat deformation delivery to the sample table can be prevented.

Flexure mechanism (50) can be formed by one body on the second slide (30), but it can also be formed and connected by an extra member.

Referring to FIGS. 1 and 2, measuring part (60) measures the position of sample (41) which is mounted on sample table (40) and traveled by the laser beam, and includes of laser head (61), which is attached to the moving path of first and second slides (20, 30), and outputs the laser beam, beam divider (62) which divides the laser beam output from the laser head (61) into the X beam and Y beam, interferometer (63), which outputs the beam divided by two parts by the beam divider (62) into X bar mirror (42) and Y bar mirror (43) and X, Y receiver (64), which transforms the beam into a displacement signal by receiving the interference signal reflected by the X, Y receiver (42, 43).

A process of example embodiments of the present invention are explained in more detail below.

During the operating process of sample traveling stage (1), sample position (41) is measured by measuring part, in that the X direction displacement of sample table (40) is measured by X bar mirror (42), and the Y direction displacement is measured by Y bar mirror (43).

The beam output from laser head (61), after being divided into two directive beams (X, Y) passing through beam divider (62), goes through interferometer (63), is reflected by X, Y bar mirrors (42, 43), and provides the interference at interferometer (63).

The interference signal of interferometer (63) is measured by receiver (64) of the measuring part, and is transformed into a displacement signal after the signal processing process.

If the first slide and second slide (20, 30) are deformed by excessive connection or heat expansion, the deformation of second slide (30) is delivered to sample table (40) by being absorbed through flexure mechanism (50).

In other words, although second slide (30) is deformed, as illustrated in FIG. 8*b* and FIG. 9*b*, shock-absorbing holes (53) or deformation line (54) of flexure mechanism (50) deforms to the extent of the corresponding deformation level of second slide (30) and absorbs the deformation of second slide (30).

Because the deformation of the second slide (30) is not directly delivered to sample table (40) or X, Y bar mirror (42, 43), the relative distance of sample (41) and mirror (42, 43) mounted to sample table (40) is measured correctly.

The flexure mechanism hinge part may be implemented in order to prevent the heat expansion of the slide part in the event of a temperature change.

Referring to FIG. 15, the appearance of the slide part, which fixes the sample table through a bolt connection in general, is illustrated. In the case of a temperature change as illustrated in FIG. 16, the slide part is deformed. The part indicated by a full line shows the slide appearance before deformation; and the part indicated by the dotted line shows the slide appearance after being expanded by heat.

From the center of the slide, the slide may be expanded in the radius direction. Assuming the slide is connected by bolt at the sample table and at four points, it appears that force, or power, F, (also referred to as heat expanding power), applied to every connecting part would exist due to the heat expansion occurring. The heat expansion force is calculated as per the following equation [1]:

$$F = \sigma A = E\delta A = E\frac{\Delta L}{L}A = E\frac{\alpha L\Delta T}{L}A = E\frac{\alpha L\Delta Tdb}{L} = E\alpha db \quad [1]$$

$$\text{where } A = db,\ \Delta L - \alpha L\Delta T$$

In the foregoing equation [1], a represents a heat expansion coefficient of material, E represents an elastic rate of material, A represents a cross-section of the connecting part, d represents the diameter of the connecting bolt, b represents the thickness of the slide part, L represents the distance from the center of the slide to the connecting part, and ΔL represents the deforming degree by which the connecting part is expanded by heat deformation.

Accordingly, to ensure that the heat expansion degree of the slide is not delivered to the sample table by the flexure mechanism mount, the tolerance of the flexure mechanism deformation by heat expansion force should be over ΔL.

The maximum stress to be loaded on the hinge of the flexure mechanism should be less than the yield strength, because yield phenomena should not occur despite the tolerable deformation degree of the flexure mechanism becoming ΔL.

Although the above two conditions are satisfied, the sunk phenomena toward the gravity direction would occur as a result of the total weight of the sample table, sample, and mirror fixed on the upper side of the flexure mechanism mount. However, the values should be under an appropriate level.

Accordingly, it is considered that the flexure mechanism structure that satisfies the above three conditions would be sufficient.

The following describes the determination of the condition that should be satisfied first. The strength of the single flexure mechanism should be calculated so as to estimate the deforming degree of a flexure mechanism by heat expansion force F.

For ease of understanding, the appearance of a single flexure mechanism is illustrated in FIG. 18. Although the appearance of the instrumental parts illustrated in FIGS. 17 and 18 differ from each other, the structure and mechanism are the same.

Figure 19:
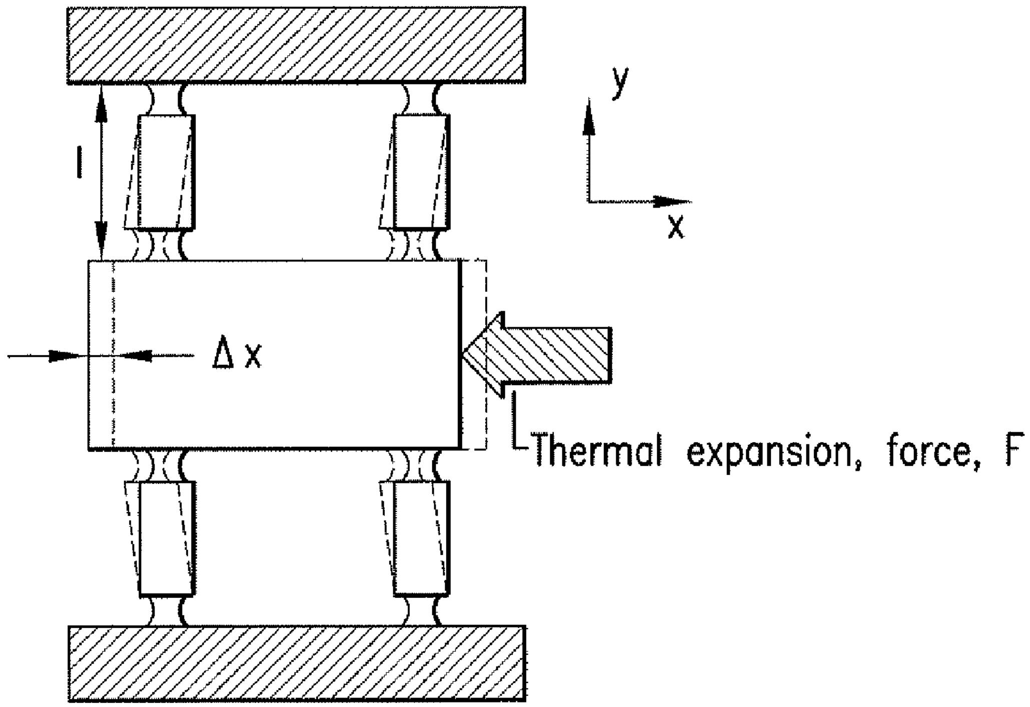
FIG. 19 illustrates the flexure mechanism illustrated in FIG. 18 in a deformed state.

The single flexure instrumental part is consisted according to the following. Reference numeral 160 represents the fixed part to the slide part or slide, reference numeral 162 represents a fixing part for the sample table, reference numeral 161 corresponds to a link part to connect the slide part and the fixing part, and reference numerals 163 to 170 represent eight hinges having a rotary free angle. In the event of heat expansion force F, the phenomenon whereby a single flexure mechanism deforms is illustrated in FIG. 19.

Figure 20:
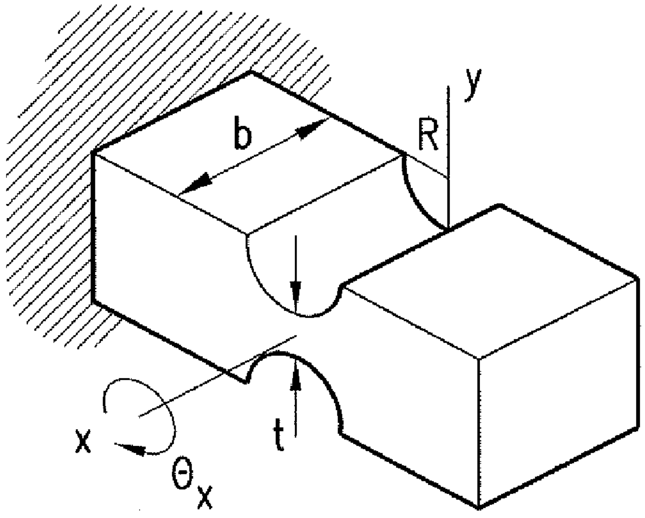
FIG. 20 illustrates a single hinge of a flexure mechanism according to example embodiments of the present invention.

The location of the fixed part changes by Δx due to the rotation of eight hinges. For the purposes of achieving deformation degree Δx, the potential energy stored through the deformation of all hinges should be calculated. The appearance of a single hinge is illustrated in FIG. 20.

The potential energy stored through the deformation of the single hinge may be calculated according to the following equation [2].

$$V = \frac{1}{2}k_\theta\left(\frac{\Delta x}{l}\right)^2 \quad [2]$$

In equation [2], $k_\theta$ represents the rotary strength of the hinge part, which may be calculated according to the following equation [3]:

$$k_\theta = \frac{2Ebt^{5/2}}{9\pi R^{1/2}} \quad [3]$$

In equation [2], Δx/l represents the rotary angle of the hinge. If the deformation degree of the hinge is very small, the rotary angle can be estimated as Δx/l. Because eight hinges are used, the potential energy stored in all hinges may be calculated according to equation [4]:

$$V = 8 \times \frac{1}{2} \times k_\theta\left(\frac{\Delta x}{l}\right)^2 \quad [4]$$

If the potential energy V is differentiated by x in order to calculate the strength, K, of the single flexure mechanism, recovery power F can be calculated and expressed according to equation [5]:

$$F = \frac{\partial V}{\partial x} = \left(\frac{\Delta x}{l^2}\right) = \frac{16\Delta xEbt^{5/2}}{9\pi R^{1/2}l^2} \quad [5]$$

Differentiating recovery force F against x, the strength of the single flexure mechanism can be calculated and expressed according to equation [6]:

$$K = \frac{F}{\Delta x} = \frac{16Ebt^{5/2}}{9\pi R^{1/2}l^2} \quad [6]$$

Deformation degree Δx, which is referred to in equations [2] to [6], of the single flexure mechanism, may be calculated according to equation [7]:

$$\Delta x = \frac{F}{K} == \frac{9\pi R^{1/2}l^2}{16Ebt^{5/2}} \times E\alpha\Delta Tdb \quad [7]$$

Deformation degree (Δx) of the single flexure mechanism should exceed ΔL (Δx>/=ΔL) so that the heat deformation degree (□L) of the slide part is not delivered to the sample table. Accordingly, the condition of equation [8] should be satisfied:

$$\frac{9\pi R^{1/2}l^2}{16Ebt^{5/2}} \times E\alpha\Delta Tdb \geq \alpha L\Delta T \quad [8]$$

$$\frac{9\pi R^{1/2}l^2Edb}{16Ebt^{5/2}L} \geq 1$$

Because the stress on the hinge should be under yield strength, the conditions need to be considered. Considering the safety coefficient, set as $\sigma_{max}=(0.1\sim0.3)\,\sigma_r$, assuming the size of the maximum stress to the hinge would be $\sigma_{max}$. The size of the moment, ($M_{max}$), to add $\sigma_{max}$ to the hinge is calculated according to equation [9]:

$$M_{max} = \frac{bt^2}{6K_t}\sigma_{max} : \sigma_{max} = (0.1 \sim 0.3)\sigma_r \quad [9]$$

$K_t$, which represents a stress concentration factor, is expressed according to equation [10]:

$$K_t = \frac{2.7t + 5.4R}{8R + t} + 0.325 \quad [10]$$

When heat expansion force F is applied to the single flexure mechanism, the force size to be added to one link becomes F/4, because it is dispersed equally among four links. Because the length of the link is l, the moment size to be added to two hinges consisting of a link becomes Fl/4. Accordingly, the moment size, (=Fl/4), applied to all hinges due to heat expansion force should be smaller than the size of $M_{max}$ so as to protect yield phenomena of the hinge, and it can be expressed according to equations [11a] and [11b]:

$$\frac{Fl}{4} \leq \frac{bt^2}{6K_t}\sigma_{max} \quad [11a]$$

$$\frac{8xEt^{1/2}K_t}{3\pi R^{1/2}l} \leq \sigma_{max} \quad [11b]$$

When the sample table is fixed to the upper flexure mechanism mount, the fixed part and the link sink or sag in the gravity direction because of the excessive weight. A condition is to maintain the value under the appropriate value. The sunk degree of the fixed part needs to be calculated.

In the case that beams have a regular sectional area, it is easy to calculate the sunk degree by the sunk formula. However, it is not easy given the flexure mechanism described herein, because the sectional area is not regular due to the described structural characteristics.

Figure 21:
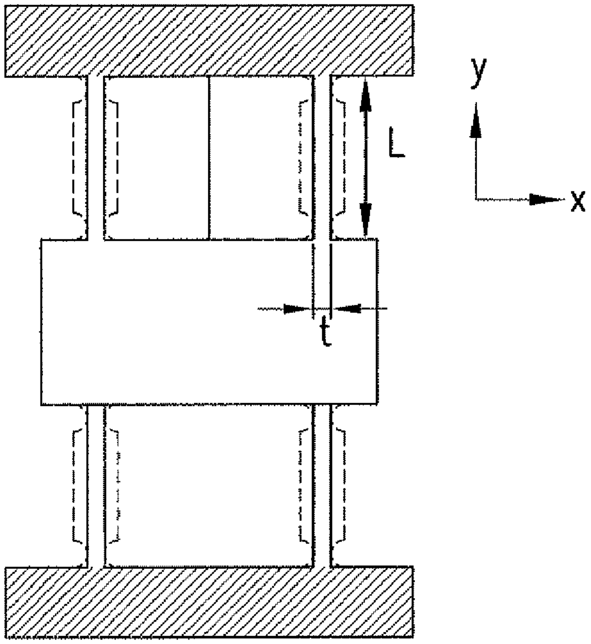
FIGS. 21 and 22 are illustrations for explaining calculation of a sunk degree of a flexure mechanism.

Accordingly, a worst condition should be assumed when calculating the sunk degree. The worst condition refers to the case in which beams of the flexure mechanism include the same sectional area as the hinge and the indented area illustrated in FIG. 7. In this regard, reference is made to FIG. 21.

It is assumed that the total sum of the fixing part mass of the flexure mechanism mount is the mass of the sample test to be fixed to the upper area and the mass of the mirror and the sample. The weight, which is dispersed to four flexure mechanisms equally, can be regarded as a force equal to Mg/4 in the gravity direction on the fixing part of the single flexure mechanism. The sink phenomenon of the flexure mechanism is the same as illustrated in FIG. 8.

Figure 22:
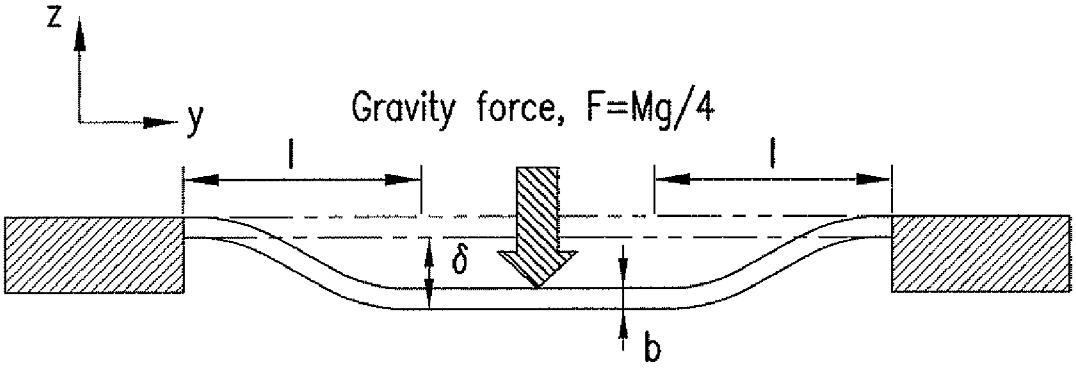

Referring to FIG. 22, the sink degree δ of the flexure mechanism is expressed according to equation [12] from the beam sink formula:

$$\delta = \frac{1}{12EI}Fl^2 = \frac{1}{12EI}\left(\frac{Mg}{4}\right)l^3 \quad [12]$$

Viewing the sectional appearance of the beam, (referring to FIGS. 7 and 8), it is a rectangular shape with a width of t and a height of b. Therefore, the area moment of inertia is the same as in equation [13]:

$$I = \frac{I}{12}tb^3 \quad [13]$$

Accordingly, the sink degree δ is calculated according to equation [14]:

$$\delta = \frac{Mgl^3}{3Etb^3} \quad [14]$$

It is sufficient that this value would be under the appropriate sink limit value ($\delta_{limit}$).

Accordingly, to provide a desirable flexure mechanism, the conditions mentioned, e.g., in equations [8], [11], and [14], above should all be satisfied.

LIST OF REFERENCE NUMERALS

1 sample traveling stage
10 base frame
11, 31 guide rail
20 first slide
21 first guide block
30 second slide
32 second guide block
40 sample table
41 sample
42, 43 X, Y bar mirror
50 flexure mechanism
52 mounting part
53 shock-absorbing hole
54 deformation line
63 interferometer
64 receiver
160 fixed part of the slide
161 link part
162 fixing part of the sample table
164 to 170 hinges

What is claimed is:

1. A sample traveling stage, comprising:

a movable part including a first slide and a second slide arranged in a mutually crossing direction, the first slide mounted on a base frame and movable along a first guide block, the second slide mounted on the first slide and movable along a second guide block; and a traveling part including a sample table configured to travel a sample, the sample table connected to the second slide by a flexure mechanism module;

wherein the flexure mechanism module includes a plurality of shock-absorbing holes that penetrate an upper side of the second slide along a vertical direction regularly at certain intervals and a plurality of deformation lines that meet at centers of the shock-absorbing holes, the flexure mechanism module configured to provide a deformation space of a bridge part and a mounting part and to absorb slide deformations.

2. The sample traveling stage according to claim 1, wherein a flexure mechanism module adapted to absorb slide deformation is provided at each of four corners of the second slide.

3. The sample traveling stage according to claim 1, wherein a flexure mechanism module adapted to absorb slide deformation is provided at two corners of one side and a second of another side of the second slide.

4. The sample traveling stage according to claim 1, wherein at least five flexure mechanism modules are provided on the second slide one of (a) symmetrically and (b) asymmetrically.

5. The sample traveling stage according to claim 1, wherein an upper side of the mounting part includes a shock-absorbing material in contact with the sample table.

6. The sample traveling stage according to claim 1, wherein a contact area of the mounting part and the bridge part has at least one of (a) linear shape, (b) a semi-circular shape, and (c) an elliptical shape.

7. The sample traveling stage according to claim 1, wherein the flexure mechanism module is connected to the second slide.

8. The sample traveling stage according to claim 1, wherein at least one of the following criteria is satisfied:

(a) $\Delta x \geqq \Delta L$, Δx representing a deformation degree of a flexure mechanism part and ΔL representing a deformation degree of a slide part;

(b) $Fl/4 \leqq M_{max}$, $M_{max}$ representing a total mass of mounted parts, including the sample table and the sample, F representing a heat expansion force, and l representing a length of a link; and (c) $\sigma = \delta_{limit}$, a representing a sunk degree of a flexure mechanism part and $\delta_{limit}$ representing a sunk degree limit of the flexure mechanism part.

9. The sample traveling stage according to claim 1, wherein the traveling part includes X- and Y-bar mirrors mounted on the sample table, the sample traveling stage further comprising a measurement part including a laser head, a beam divider, and an interferometer arranged in an operating path of the movable part, the measurement part configured to output a displacement signal by reception from a receiver of an input beam interference signal reflected by the X- and Y-bar mirrors.

* * * * *